(12) United States Patent
Rocznik et al.

(10) Patent No.: US 8,093,891 B2
(45) Date of Patent: Jan. 10, 2012

(54) VERTICAL HALL EFFECT SENSOR

(75) Inventors: Thomas Rocznik, Mountain View, CA (US); Christoph Lang, Cupertino, CA (US); Sam Kavusi, Menlo Park, CA (US)

(73) Assignee: Robert Bosch GmbH, Stuttgart (DE)

( * ) Notice: Subject to any disclaimer, the term of this patent is extended or adjusted under 35 U.S.C. 154(b) by 323 days.

(21) Appl. No.: 12/396,204

(22) Filed: Mar. 2, 2009

(65) Prior Publication Data

US 2010/0219821 A1   Sep. 2, 2010

(51) Int. Cl.
  *G01R 33/06*  (2006.01)
(52) U.S. Cl. ........................................................ 324/251
(58) Field of Classification Search .................. None
  See application file for complete search history.

(56) References Cited

U.S. PATENT DOCUMENTS

| 4,829,352 | A | * | 5/1989 | Popovic et al. | 324/252 |
| 4,929,993 | A | * | 5/1990 | Popovic | 257/424 |
| 5,572,058 | A | * | 11/1996 | Biard | 324/252 |
| 7,253,490 | B2 | * | 8/2007 | Oohira | 257/424 |
| 2005/0230770 | A1 | * | 10/2005 | Oohira | 257/421 |
| 2006/0011999 | A1 | * | 1/2006 | Schott et al. | 257/421 |
| 2006/0157809 | A1 | * | 7/2006 | Alimi et al. | 257/421 |
| 2006/0170406 | A1 | | 8/2006 | Kawashima et al. | |
| 2010/0219810 | A1 | * | 9/2010 | Rocznik et al. | 324/207.2 |
| 2011/0050210 | A1 | * | 3/2011 | Schrems et al. | 324/207.2 |

FOREIGN PATENT DOCUMENTS

WO   0002266   1/2000

OTHER PUBLICATIONS

Ralph Steiner Vanha et al: "Trench-Hall Devices" Journal of Microelectromechanical Systems, IEEE Service Center, Piscataway, NJ, US, vol. 9 No. 1, Mar. 1, 2000, XP011034553 ISSN: 1057-7157; pp. 82-87 (6 pages).

* cited by examiner

*Primary Examiner* — Jermele M Hollington
(74) *Attorney, Agent, or Firm* — Maginot, Moore & Beck

(57) ABSTRACT

A complimentary metal oxide semiconductor (CMOS) sensor system in one embodiment includes a doped well extending along a first axis of a doped substrate, a first electrical contact positioned within the doped well, a second electrical contact positioned within the doped well and spaced apart from the first electrical contact along the first axis, a third electrical contact positioned within the doped well and located between the first electrical contact and the second electrical contact along the first axis, and a fourth electrical contact electrically coupled to the doped well at a location of the doped well below the third electrical contact.

18 Claims, 3 Drawing Sheets

VERTICAL HALL EFFECT SENSOR

BACKGROUND

The invention relates to magnetic field sensors and more specifically to CMOS Hall Effect sensors.

BACKGROUND

Hall Effect sensors are among the most widely used magnetic sensors. Hall Effect sensors incorporate a Hall Effect plate, which is either an n- or p-doped area, supplied with bias current/voltage. In presence of a magnetic field the carriers that are moving in the doped area are deflected by the Lorentz force, and a Hall electrical field appears. The Hall voltage Vh appears across the positive and negative contacts of the Hall Effect plate. Front-end circuitry provided with the sensor converts the Hall voltage to a data indicative of the sensed magnetic field.

Magnetic detection by standard CMOS Hall devices is thus limited to the field perpendicular to the chip surface. In many scenarios, however, measurement of the magnetic field in two or even three dimensions is desired. Packaging sensors for measuring multiple dimensions of a magnetic field can be accomplished by packaging chips perpendicular to each other. This approach, however, requires the use of specialized technology during the manufacturing process and special alignment of the equipment resulting in increased manufacturing costs.

Alternatively, vertical Hall effect devices may be used. U.S. Pat. No. 4,929,993, issued on May 29, 1990 discloses one such device. In these devices, the current flows in the Z (out of plane) direction. These devices, however, exhibit low sensitivity, instability, and excessive cross-talk between different dimensions of the magnetic field. Yet another approach is to use a single chip with magnetic concentrators. This approach results in higher post processing costs.

An out of plane sensor that can be combined with other circuits on a chip is beneficial. A packaged sensor capable of sensing the out of plane component of a magnetic field is useful. The ability to package a sensor capable of measuring more than one dimension of a magnetic field would also be useful. A method of manufacturing such a device in a commonly used semiconductor process, e.g. CMOS, would be beneficial.

SUMMARY

In accordance with one embodiment, a complimentary metal oxide semiconductor (CMOS) sensor system includes a doped well extending along a first axis of a doped substrate, a first electrical contact positioned within the doped well, a second electrical contact positioned within the doped well and spaced apart from the first electrical contact along the first axis, a third electrical contact positioned within the doped well and located between the first electrical contact and the second electrical contact along the first axis, and a fourth electrical contact electrically coupled to the doped well at a location of the doped well below the third electrical contact.

In accordance with another embodiment, a complimentary metal oxide semiconductor (CMOS) sensor system includes a first doped contact on a top surface of a doped substrate, a second doped contact on the top surface of the doped substrate, a third doped contact on the top surface of the doped substrate and located between the first doped contact and the second doped contact, a first doped well conductively coupled to each of the first doped contact, the second doped contact, and the third doped contact, and a fourth electrical contact on the top surface of the doped substrate and electrically coupled to the first doped well at a location of the first doped well directly underneath the third electrical contact.

In yet another embodiment, a method of sensing a magnetic field includes supplying a current to a first doped well portion through a first doped contact at a top surface of a substrate, discharging at least a first portion of the current from the first doped well portion through a second doped contact at the top surface of the substrate, exposing the at least a first portion of the current moving along the first doped well portion between the first doped contact and the second doped contact to a magnetic field, generating a first Hall voltage between the top surface of the substrate and a portion of the substrate underlying the top surface with the at least a first portion of the current, and detecting the first Hall voltage using a third doped contact at the top surface of the substrate and a fourth doped contact at the top surface of the substrate.

DESCRIPTION

Figure 1:
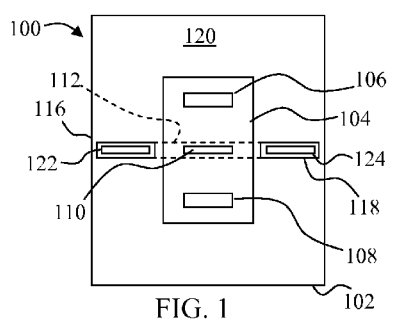
FIG. 1 depicts a top plan view of a sensor configured to measure the component of a magnetic field that is parallel to the upper surface of the sensor and orthogonal to a doped well extending between two surface contacts.
Figure 2:
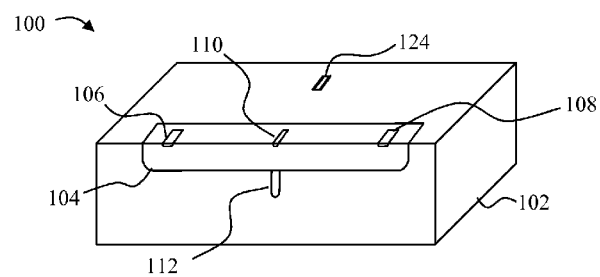
FIG. 2 depicts a perspective cutaway view of the sensor of FIG. 1.
Figure 3:
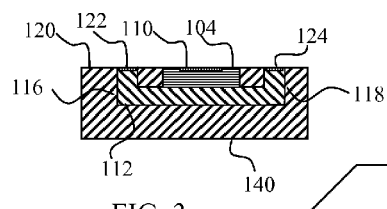
FIG. 3 depicts a cross-sectional view of the sensor of FIG. 1.
Figure 4:
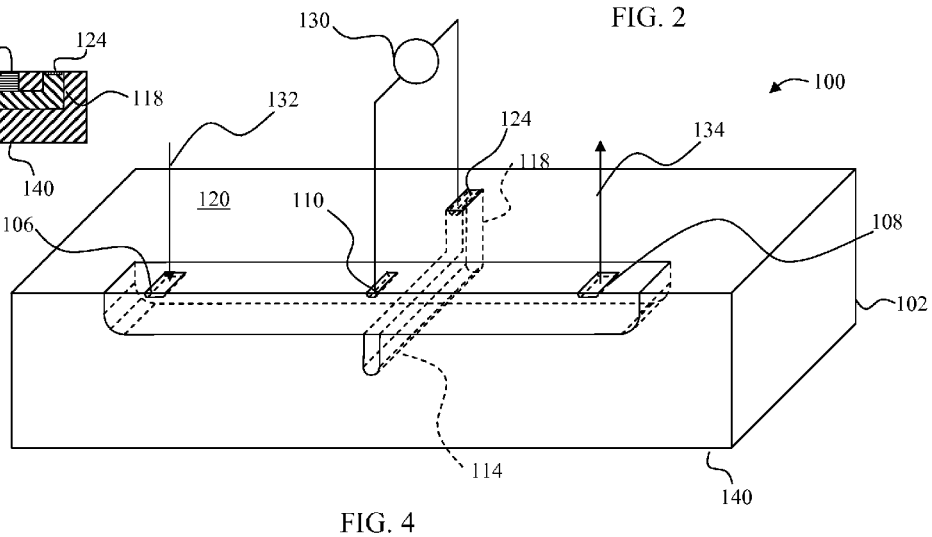
FIG. 4 depicts a perspective cutaway view the sensor of FIG. 1 with shadow lines detailing the internal positioning of the doped components of the sensor including a current input and output contact located within a doped well, a Hall voltage detector connected to a contact located in the doped well between the current contacts, and a buried doped well extending orthogonally below the doped well and upwardly to the surface of the sensor substrate.

A vertical Hall Effect sensor 100 is depicted in FIGS. 1-4. The sensor 100 is formed in a substrate 102 which in this embodiment is p-doped. The doping of the substrate 102 and the other components of the sensor 100 may be reversed if desired.

Within the p-doped substrate 102, an n- doped well 104 extends between an n+ doped contact 106 and another n+ doped contact 108. A third n+ doped contact 110 is located within the n- doped well 104 at a location midway between the n+ doped contact 106 and the n+ doped contact 108.

A second n- doped well 112 includes a first portion 114 that extends from a beneath the n- well 104 to an upwardly extending portion 116 of the n- doped well 112 located on a first side of the n- well 104. A second upwardly extending portion 118 is located on the opposite side of the n− well 104. The portions 116 and 118 extend upwardly to the top surface 120 of the substrate 102 at a location spaced apart from the n−doped well 104. One n+ doped contact 122 is located within the portion 116 at the top surface 120 of the substrate 102 and another n+ doped contact 124 is located within the portion 118 at the top surface 120 of the substrate 102.

In operation, a Hall voltage measuring device 130 is positioned across the contacts 110 and 124. The Hall voltage measuring device 130 may be a circuit on the substrate 102 or an off chip device which amplifies the Hall voltage. Next, a current is supplied to the contact 106 as indicated by the arrow 132 in FIG. 2 with a return path (arrow 134) provided through the contact 108. Within the substrate 102, the current will flow through the n− doped well 104 from the contact 106 to the contact 108.

In the presence of a magnetic field with a component that is parallel to the upper surface 120 and orthogonal to the axis defined by the n− doped well 104 between the contact 106 to the contact 108, the Lorentz force influences the path of the current travelling within the n− doped well 104. For example, in n type doped materials the electrons, depending upon the direction of the magnetic field, may be forced toward the upper surface 120 or toward the lower surface 140.

Accordingly, a Hall voltage is established between the contact 110 and the upper part of the portion 114 of the well 112, which is in contact with the well 104. Consequently, the Hall voltage that is established between the contact 110 and the contact 122, by way of the buried well 112, is detected by the Hall voltage measuring device 130. If desired, another voltmeter may be connected between the contact 110 and the contact 124.

Figure 5:
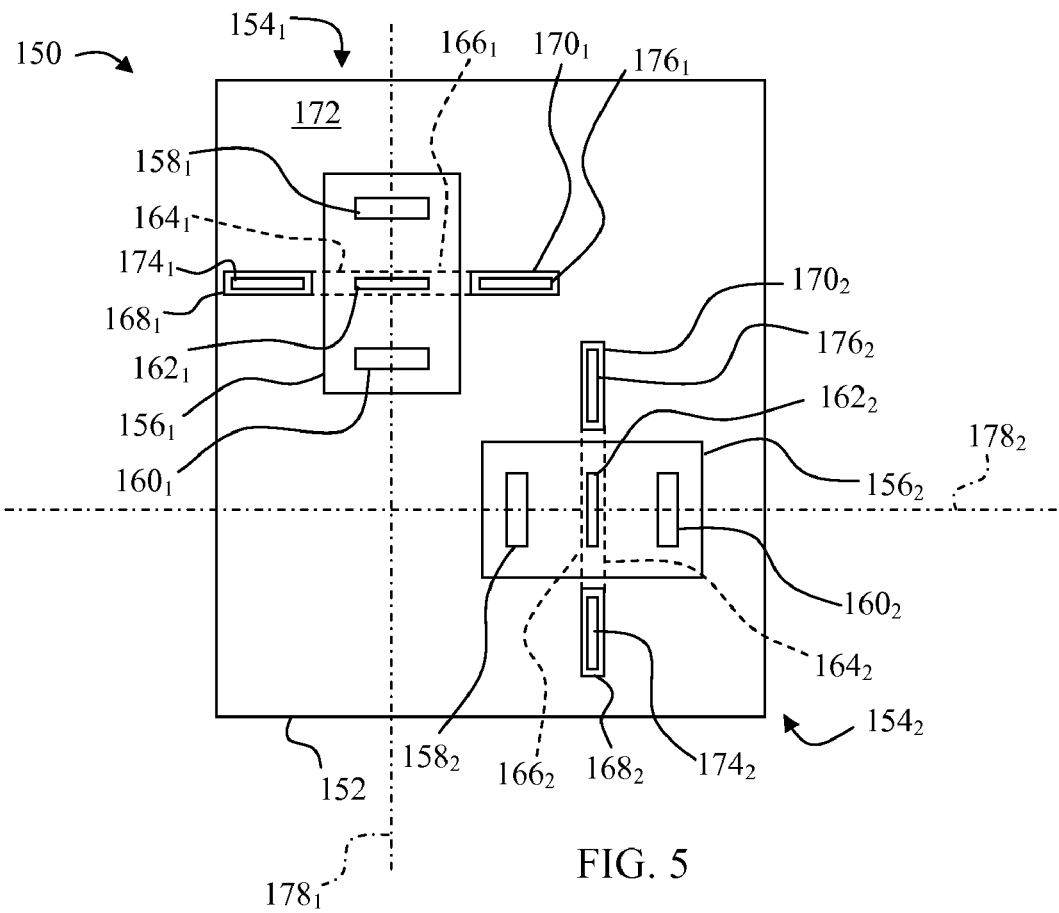
FIG. 5 depicts a top plan view of a substrate with two sensors oriented at ninety degrees with respect to one another to provide sensing of a magnetic field along both the x-axis and the y-axis of the substrate.

An alternative sensor system 150 is shown in FIG. 5. The sensor system 150 is formed in a substrate 152 which in this embodiment is p-doped. The doping of the substrate 152 and the other components of the sensor system 150 may be reversed if desired.

The sensor system 150 includes two sensors $154_1$ and $154_2$. The sensors $154_x$ are substantially identical to the sensor 100. Thus, each of the sensors $154_x$ include an n− doped well $156_x$ which extends between an n+ doped contact $158_x$ and another n+ doped contact $160_x$. A third n+ doped contact $162_x$ is located within the n− doped well $156_x$ at a location midway between the n+ doped contact $156_x$ and the n+ doped contact $158_x$.

A second n− doped well $164_x$ includes a first portion $166_x$ that extends from a beneath the n− well $156_x$ to an upwardly extending portion $168_x$ of the n− doped well 164 located on a first side of the n− well $156_x$. A second upwardly extending portion $170_x$ is located on the opposite side of the n− well $156_x$. The portions $168_x$ and $170_x$ extend upwardly to the top surface $172_x$ of the substrate $152_x$ at a location spaced apart from the n− doped well $156_x$. One n+ doped contact $174_x$ is located within the portion $168_x$ at the top surface $172_x$ of the substrate $152_x$ and another n+ doped contact $176_x$ is located within the portion $170_x$ at the top surface $172_x$ of the substrate $152_x$.

The sensor system 150 functions in substantially the same manner as the sensor 100. The primary difference results from the orientation of the second n− doped wells $164_1$ and $164_2$. Specifically, the centerline $178_1$ of the sensor $154_1$ defines an axis that is orthogonal to an axis defined by the centerline $178_2$ of the sensor $154_2$. Accordingly, while the path of a current travelling within the n− doped well $156_1$ is not influenced by the Lorentz force by a component of a magnetic field that is parallel to the upper surface 172 and parallel to the centerline $178_1$, that same magnetic field component will be orthogonal to the centerline $178_2$. Thus, the sensor $154_2$ will sense the magnetic field component that is not sensed by the sensor $154_1$. Similarly, the sensor $154_1$ will sense a component of a magnetic field that is parallel to the upper surface 172 and parallel to the centerline $178_2$ that is not sensed by the sensor $154_2$.

Accordingly, the sensor system 150 provides sensing of a magnetic filed in both the x-axis and the y-axis.

Figure 6:
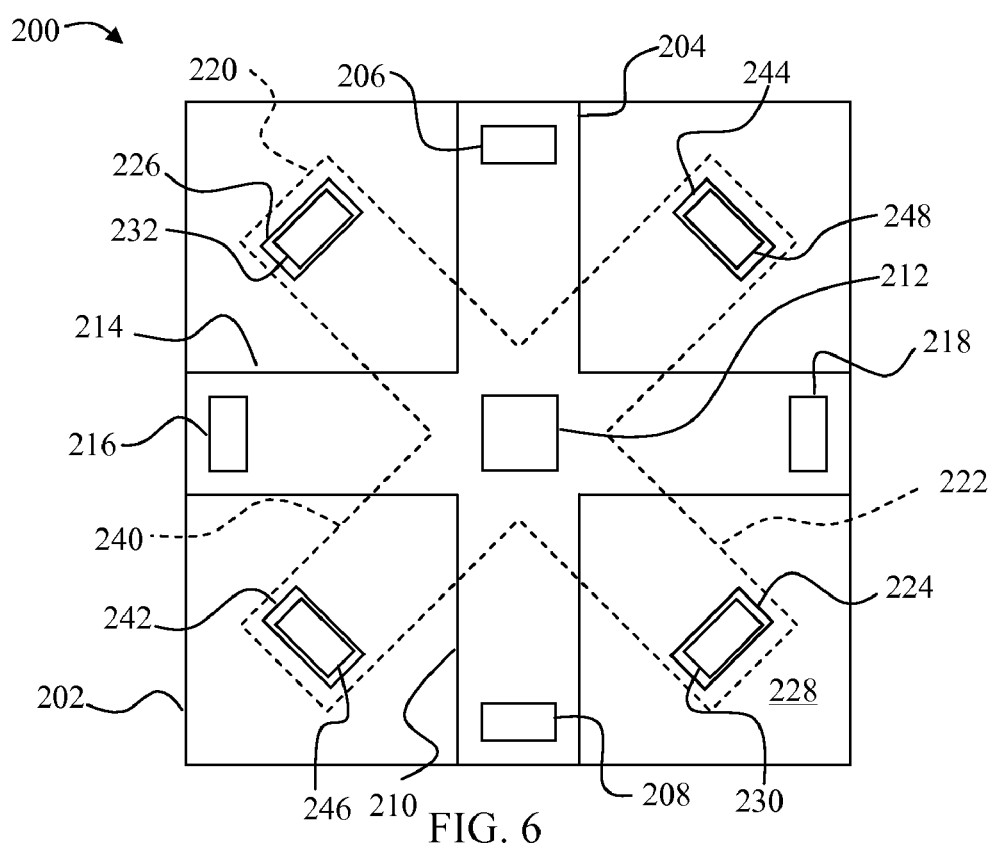
FIG. 6 depicts a top plan view of a sensor device with a surface n doped well and a buried n doped well with multiple surface contacts which may be configured in multiple ways to provide sensing of magnetic fields in the x-axis, the y-axis, and the z-axis of the substrate.
Figure 7:
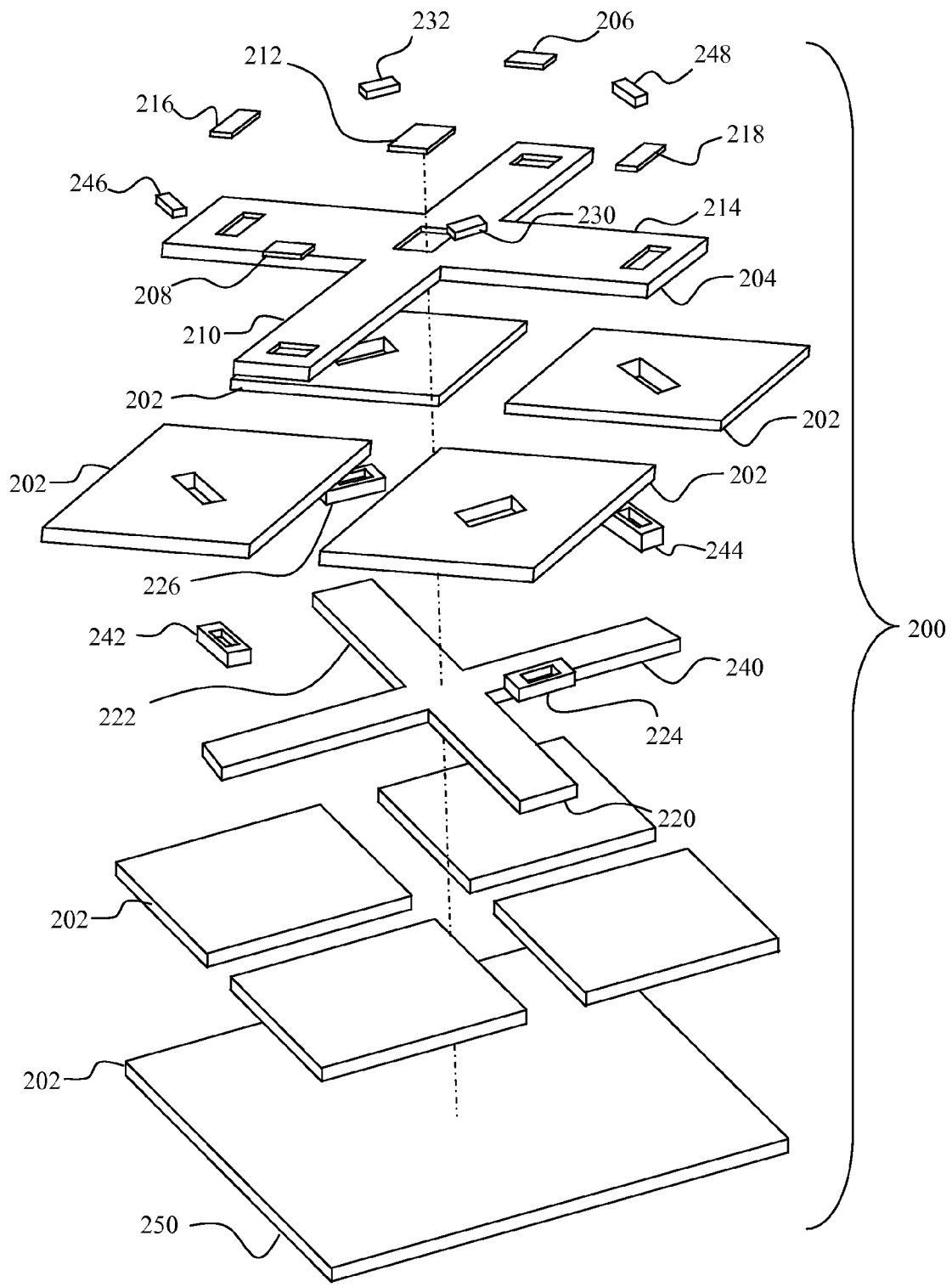
FIG. 7 depicts an exploded perspective view of the sensor system of FIG. 6 showing the doping at different layers of the device wherein differently doped areas within a given layer are separated.

An alternative sensor 200 for sensing a magnetic field in the x-axis, the y-axis, and the z-axis is depicted in FIGS. 6-7. The sensor 200 is formed in a substrate 202 which in this embodiment is p-doped. The doping of the substrate 202 and the other components of the sensor 200 may be reversed if desired.

Within the p-doped substrate 202, an n− doped well 204 extends between an n+ doped contact 206 and another n+ doped contact 208 along a first leg 210. A third n+ doped contact 212 is located within the n− doped well 204 at a location midway between the n+ doped contact 206 and the n+ doped contact 208. A second leg 214 of the n− doped well 204 extends between an n+ doped contact 216 and another n+ doped contact 218. The n+ doped contact 212 is located within the n− doped well 204 at a location midway between the n+ doped contact 216 and the n+ doped contact 218.

A second n− doped well 220 includes a first leg 222 that extends beneath the intersection of the leg 210 and the leg 214 of the n− well 204 from an upwardly extending portion 224 of the n− doped well 220 to an upwardly extending portion 226 of the n− doped well 220. The portion 224 extends upwardly to the top surface 228 of the substrate 202 at a location spaced apart from the leg 210 and the leg 214 of the n− doped well 204. One n+ doped contact 230 is located within the portion 224 at the top surface 228 of the substrate 202. The portion 226 also extends upwardly to the top surface 228 of the substrate 202 at a location spaced apart from the leg 210 and the leg 214 of the n− doped well 204. Another n+ doped contact 232 is located within the portion 226 at the top surface 228 of the substrate 202.

Another leg 240 of the that n− doped well 220 extends beneath the intersection of the leg 210 and the leg 214 of the n− well 204 from an upwardly extending portion 242 of the n− doped well 240 to an upwardly extending portion 244 of the n− doped well 240. The portion 242 extends upwardly to the top surface 228 of the substrate 202 at a location spaced apart from the leg 210 and the leg 214 of the n− doped well 204. One n+ doped contact 246 is located within the portion 242 at the top surface 228 of the substrate 202. The portion 244 also extends upwardly to the top surface 228 of the substrate 202 at a location spaced apart from the leg 210 and the leg 214 of the n− doped well 204. Another n+ doped contact 248 is located within the portion 244 at the top surface 228 of the substrate 202.

The sensor 200 functions in fundamentally the same manner as the sensor 100. The difference in structure, however, allows the sensor 200 to be configured and/or operated in a variety of ways to sense components of a magnetic field. By way of example, a current may be introduced into the sensor 200 through the contact 206 and drawn out through the contact 208. Accordingly, within the substrate 202, the current will flow through the n− doped well 204 along the leg 210 from the contact 206 to the contact 208. Consequently, in the presence of a magnetic field with a component that is parallel to the upper surface 228, and orthogonal to the axis defined by the leg 210 of the n− doped well 204, the Lorentz force influences the path of the current travelling within the leg 210 of the n− doped well 204. For example, in n type doped materials the electrons, depending upon the direction of the magnetic field, may be forced toward the upper surface 228 or toward the lower surface 250.

Accordingly, a Hall voltage is generated between the upper surface 228 and the lower surface 250 within the leg 210. The Hall voltage is thus established between the contact 212 and the upper part of the intersection of the legs 222 and 240 of the well 220, which is in contact with the well 204. Consequently, the Hall voltage may be measured between the contact 212 and any of the contacts 230, 232, 246, or 248.

Additionally, a current may be introduced into the sensor 200 through the contact 216 and drawn out through the contact 218. Accordingly, within the substrate 202, the current will flow through the n– doped well 204 along the leg 214 from the contact 216 to the contact 218. Consequently, in the presence of a magnetic field with a component that is parallel to the upper surface 228, and orthogonal to the axis defined by the leg 214 of the n– doped well 204, the Lorentz force influences the path of the current travelling within the leg 214 of the n– doped well 204. For example, in n type doped materials the electrons, depending upon the direction of the magnetic field, may be forced toward the upper surface 228 or toward the lower surface 250.

Accordingly, a Hall voltage is generated between the upper surface 228 and the lower surface 250 within the leg 214. The Hall voltage is thus established between the contact 212 and the upper part of the intersection of the legs 222 and 240 of the well 220, which is in contact with the well 204. Consequently, the Hall voltage may be measured between the contact 212 and any of the contacts 230, 232, 246, or 248.

The sensor 200 may also be used to sense a magnetic field with a component that is perpendicular to the upper surface 228. By way of example, a current may be introduced into the sensor 200 through the contact 216 and drawn out through the contact 218. Accordingly, within the substrate 202, the current will flow through the n– doped well 204 along the leg 214 from the contact 216 to the contact 218. Consequently, in the presence of a magnetic field with a component that is perpendicular to the upper surface 228, the Lorentz force influences the path of the current travelling within the leg 214 of the n– doped well 204. For example, in n type doped materials the electrons, depending upon the direction of the magnetic field, may be forced toward the contact 206 or toward the contact 208.

Accordingly, a Hall voltage is generated between the contact 206 and the contact 208 within the leg 210. Consequently, the Hall voltage may be measured between the contact 206 and the contact 208.

Moreover, current may likewise be caused to flow through the leg 210 (e.g., through the contact 206), the leg 222 (e.g., through the contact 232), and the leg 240 (e.g., through the contact 246), to produce a Hall voltage measurable across the contacts in the intersecting leg in response to a component of a magnetic field perpendicular to the surface 228.

The sensor 200 is thus capable of sensing magnetic fields along the x-axis, the y-axis, and the z-axis of the sensor 200. As such, the sensor 200 may be used in various applications such as, but not limited to, a complimentary metal oxide semiconductor (CMOS) compass, a sensor for detecting and measuring the components of a magnetic field generated by different magnetic sources, and the detection of a magnetic bead fielding order to detect a cell or molecule.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A complimentary metal oxide semiconductor (CMOS) sensor system, comprising:
   a doped well extending along a first axis of a doped substrate:
   a first electrical contact positioned within the doped well;
   a second electrical contact positioned within the doped well and spaced apart from the first electrical contact along the first axis;
   a third electrical contact positioned within the doped well and located between the first electrical contact and the second electrical contact along the first axis; and
   a fourth electrical contact spaced apart from the doped well at an upper surface of the sensor system and electrically coupled to the doped well at a location of the doped well below the third electrical contact.

2. The system of claim 1, further comprising:
   a buried doped well electrically coupled to the doped well and including a first portion extending beneath the doped well along a second axis and a second portion extending upwardly from the first portion to the surface of the doped substrate at a location spaced apart from the doped well, wherein the fourth electrical contact is located within the second portion.

3. The system of claim 2, further comprising:
   a Hall Effect detector operably coupled to the third electrical contact and the fourth electrical contact; and
   a current source operably coupled to the first electrical contact and the second electrical contact.

4. The system of claim 2, wherein the substrate is a p doped substrate.

5. The system of claim 4, wherein:
   the doped well is an n–doped well; and
   the first electrical contact, the second electrical contact, the third electrical contact, and the fourth electrical contact are each n+doped electrical contacts.

6. The system of claim 1, wherein the doped well further extends along a second axis, the second axis perpendicular to the first axis, the system further comprising:
   a fifth electrical contact positioned within the doped well and spaced apart from the third electrical contact along the second axis; and
   a sixth electrical contact positioned within the doped well and located on the side of the third electrical contact opposite to the fifth electrical contact along the second axis.

7. A complimentary metal oxide semiconductor (CMOS) sensor system, comprising:
   a first doped contact on a top surface of a doped substrate;
   a second doped contact on the top surface of the doped substrate;
   a third doped contact on the top surface of the doped substrate and located between the first doped contact and the second doped contact;
   a first doped well leg conductively coupled to each of the first doped contact, the second doped contact, and the third doped contact; and
   a fourth doped contact on the top surface of the doped substrate and electrically coupled to the first doped well at a location of the first doped well directly underneath the third doped contact.

8. The system of claim 7, further comprising:
   a second doped well electrically coupled to the first doped well directly underneath the third doped contact and including an upwardly extending portion which extends to the surface of the doped substrate at a location spaced apart from the first doped well, wherein the fourth doped contact is located within the upwardly extending portion.

9. The system of claim 8, further comprising:
a Hall Effect detector operably coupled to the third doped contact and the fourth doped contact; and
a current source operably coupled to the first doped contact and the second doped contact.

10. The system of claim 8, wherein the substrate is a p doped substrate.

11. The system of claim 10, wherein:
the first doped well is an n–doped well; and
the first doped contact, the second doped contact, the third doped contact, and the fourth doped contact are each n+doped contacts.

12. The system of claim 7, further comprising:
a fifth doped contact on the top surface of the doped substrate;
a sixth doped contact on the top surface of the doped substrate positioned such that the third doped contact is located between the sixth doped contact and the fifth doped contact;
a second doped well leg conductively coupled to each of the third doped contact, the fifth doped contact, and the sixth doped contact; and
a seventh doped contact on the top surface of the doped substrate and electrically coupled to the second doped well leg at a location of the second doped well leg directly underneath the third doped contact.

13. The system of claim 12, wherein:
the first doped well leg defines a first axis;
the second doped well leg defines a second axis; and
the first axis intersects the second axis.

14. The system of claim 13, wherein the first axis and the second axis form a ninety degree angle.

15. A method of sensing a magnetic field comprising:
supplying a first current to a first doped well through a first doped contact at a top surface of a substrate;
discharging the first current from the first doped well through a second doped contact at the top surface of the substrate;
exposing the first current moving along the first doped well between the first doped contact and the second doped contact to a magnetic field;
generating a first Hall voltage between the top surface of the substrate and a portion of the substrate underlying the top surface with the first current; and
detecting the first Hall voltage using a third doped contact at the top surface of the substrate and a fourth doped contact at the top surface of the substrate, wherein the fourth doped contact is at a location spaced apart from the first doped well at the top surface of the substrate.

16. The method of claim 15, wherein the fourth doped contact is electronically coupled with the underlying portion of the substrate through a second doped well, a sub portion of the second doped well extending beneath a sub portion of the first doped well.

17. The method of claim 16, further comprising:
electrically coupling the first doped well and the second doped well at a location directly beneath the third doped contact.

18. The method of claim 15, further comprising:
supplying a second current to the first doped well through a fourth doped contact at the top surface of the substrate;
discharging the second current from the first doped well through a fifth doped contact at the top surface of the substrate;
exposing the second current moving along the first doped well between the fourth doped contact and the fifth doped contact to a magnetic field;
generating a second Hall voltage between the first doped contact and the second doped contact with the second current; and
detecting the second Hall voltage using the first doped contact and the second doped contact.

* * * * *